(12) United States Patent
Harris et al.

(10) Patent No.: US 8,566,377 B2
(45) Date of Patent: Oct. 22, 2013

(54) SECURE RANDOM NUMBER GENERATOR

(75) Inventors: Edward B. Harris, Fogelsville, PA (US); Richard Hogg, Laurys Station, PA (US); Ross A. Kohler, Allentown, PA (US); Richard J. McPartland, Nazareth, PA (US); Wayne E. Werner, Coopersburg, PA (US)

(73) Assignee: Agere Systems LLC, Allentown, PA (US)

( * ) Notice: Subject to any disclaimer, the term of this patent is extended or adjusted under 35 U.S.C. 154(b) by 538 days.

(21) Appl. No.: 12/934,510

(22) PCT Filed: May 23, 2008

(86) PCT No.: PCT/US2008/064679
§ 371 (c)(1),
(2), (4) Date: Sep. 24, 2010

(87) PCT Pub. No.: WO2009/142645
PCT Pub. Date: Nov. 26, 2009

(65) Prior Publication Data
US 2011/0022648 A1      Jan. 27, 2011

(51) Int. Cl.
*G06F 7/58*      (2006.01)
(52) U.S. Cl.
USPC ............................................. 708/250
(58) Field of Classification Search
None
See application file for complete search history.

(56) References Cited

U.S. PATENT DOCUMENTS

| 7,266,025 | B2 | 9/2007 | Nagai et al. |
| 7,308,567 | B2 | 12/2007 | Yamamoto et al. |
| 7,925,928 | B2 | 4/2011 | Yamamoto et al. |
| 2004/0062084 | A1 | 4/2004 | Layman et al. |
| 2005/0076274 | A1 | 4/2005 | Nagai et al. |
| 2005/0144430 | A1 | 6/2005 | Yamamoto et al. |
| 2008/0082860 | A1 | 4/2008 | Yamamoto et al. |
| 2009/0049111 | A1* | 2/2009 | Chari et al. ............ 708/254 |
| 2011/0022648 | A1* | 1/2011 | Harris et al. ............ 708/254 |

FOREIGN PATENT DOCUMENTS

| CN | 101183313 A | 5/2008 |
| JP | 2005116003 A | 4/2005 |
| JP | 2005190201 A | 7/2005 |
| WO | PCT/US2008/064679 | 12/2008 |

* cited by examiner

*Primary Examiner* — David H Malzahn
(74) *Attorney, Agent, or Firm* — Ryan, Mason & Lewis, LLP

(57) ABSTRACT

A random number generator circuit includes a first memory having multiple storage elements. Each of the storage elements has an initial state corresponding thereto when powered up by a voltage supply source applied to the first memory. The first memory is operative to generate a first signal including multiple bits indicative of the respective initial states of the storage elements. The random number generator circuit further includes an error correction circuit coupled to the first memory. The error correction circuit is operative to receive the first signal and to correct at least one bit in the first signal that is not repeatable upon successive applications of power to the first memory to thereby generate a second signal. The second signal is a random number that is repeatable upon successive applications of power to the first memory.

20 Claims, 3 Drawing Sheets

SECURE RANDOM NUMBER GENERATOR

FIELD OF THE INVENTION

The present invention relates generally to the electrical, electronic, and computer arts, and more particularly relates to random number generation.

BACKGROUND OF THE INVENTION

In certain applications including, but not limited to, electronic commerce (e-commerce), portable communications devices (e.g., cell phones), solid-state media storage devices, etc., security codes are required in order to protect stored data and/or device usage. Security codes, or codes or numbers upon which such security codes are derived, are typically stored in nonvolatile memory embedded within integrated circuit (IC) chips, such as, for example, flash memory and one-time-programmable (OTP) memory. Nonvolatile memory is used to ensure that the security codes are retained in the host chip when the chip is powered down. To provide a secure environment, it is imperative that security codes are not detectable by known methods of observation or reverse engineering. Unfortunately, most conventional methods of storing security codes within embedded nonvolatile memory can be detected through visual inspection, scanning electron microscope (SEM) imaging, and/or charge measurement techniques.

For example, embedded flash memory is nonvolatile memory that can be programmed with unique security codes. However, the programmed data state of flash memory cells can be determined by known charge measurement methods. OTP memory, which includes oxide breakdown anti-fuse memory and metal or polysilicon (poly) fuse memory, can be programmed with unique security codes and is nonvolatile. However, the programmed data state of the memory cells can be determined by examination of gate oxide breakdown regions in the anti-fuse memory, using SEM or alternative imaging techniques. Likewise, the programmed data states of the respective cells in a metal or polysilicon fuse memory can be determined by layer removal and visual inspection. Consequently, conventional methods for programming security codes into nonvolatile memory lack sufficient guarantees of security and are therefore undesirable.

As an alternative to programming security codes into nonvolatile memory, security codes can be generated outside of the host chip (e.g., based at least in part on codes or random number generators), communicated to the chip and then stored in nonvolatile memory embedded within the chip. This approach, however, in undesirable in that it is susceptible to theft primarily because the security codes are known outside of the host chip environment and can therefore be intercepted and/or manipulated.

Accordingly, there exists a need for techniques for ensuring the security of stored data and/or device usage that do not suffer from one or more of the limitations exhibited by conventional approaches.

SUMMARY OF THE INVENTION

Embodiments of the present invention meet the above-noted need by providing techniques for secure random number generation. Through a repeatable generation of random numbers within a chip that is essentially impossible to discover using known observation and/or reverse engineering methodologies, techniques of the invention provide virtually theft-proof, nonvolatile memory storage for security codes.

In accordance with one aspect of the invention, a random number generator circuit is provided. The random number generator circuit includes a first memory having a plurality of storage elements. Each of the storage elements has an initial state corresponding thereto when powered up by a voltage supply source applied to the first memory. The first memory is operative to generate a first signal including a plurality of bits indicative of the respective initial states of the storage elements. The random number generator circuit further includes an error correction circuit coupled to the first memory. The error correction circuit is operative to receive the first signal and to correct at least one bit in the first signal that is not repeatable upon successive applications of power to the first memory to thereby generate a second signal. The second signal is a random number that is repeatable upon successive applications of power to the first memory. One or more random number generator circuits may be included in an integrated circuit.

In accordance with another aspect of the invention a method for generating a secure random number includes the steps of: powering up a first memory comprising a plurality of storage elements, each of the storage elements having an initial state corresponding thereto when powered up; generating a first signal comprising a plurality of bits indicative of the respective initial states of the storage elements; and correcting non-repeatable bits in the first signal to thereby generate a second signal, the second signal being a random number that is repeatable upon successive applications of power to the first memory.

In accordance with yet another aspect of the invention, an electronic system includes at least one integrated circuit including at least one random number generator circuit. The random number generator circuit comprises a first memory including a plurality of storage elements. Each of the storage elements has an initial state corresponding thereto when powered up by a voltage supply source applied to the first memory. The first memory is operative to generate a first signal including a plurality of bits indicative of the respective initial states of the storage elements. The random number generator circuit further includes an error correction circuit coupled to the first memory. The error correction circuit is operative to receive the first signal and to correct non-repeatable bits in the first signal to thereby generate a second signal as an output of the random number generator circuit. The second signal is a random number that is repeatable upon successive applications of power to the first memory. One or more random number generator circuits may be included in an integrated circuit.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an exemplary memory circuit, random number generator circuit and random number generation methods. It is to be understood, however, that the techniques of the present invention are not limited to the circuits and methods shown and described herein. Rather, embodiments of the invention are directed broadly to techniques for ensuring the security of stored data and/or device usage. Through a repeatable generation of random numbers within a chip that is essentially impossible to discover using known observation and/or reverse engineering methodologies, illustrative embodiments provide virtually theft-proof, nonvolatile memory storage for security codes. Although preferred embodiments of the invention may be fabricated in a silicon wafer, embodiments of the invention can alternatively be fabricated in wafers comprising other materials, including but not limited to gallium arsenide (GaAs), indium phosphide (InP), etc.

Figure 1:
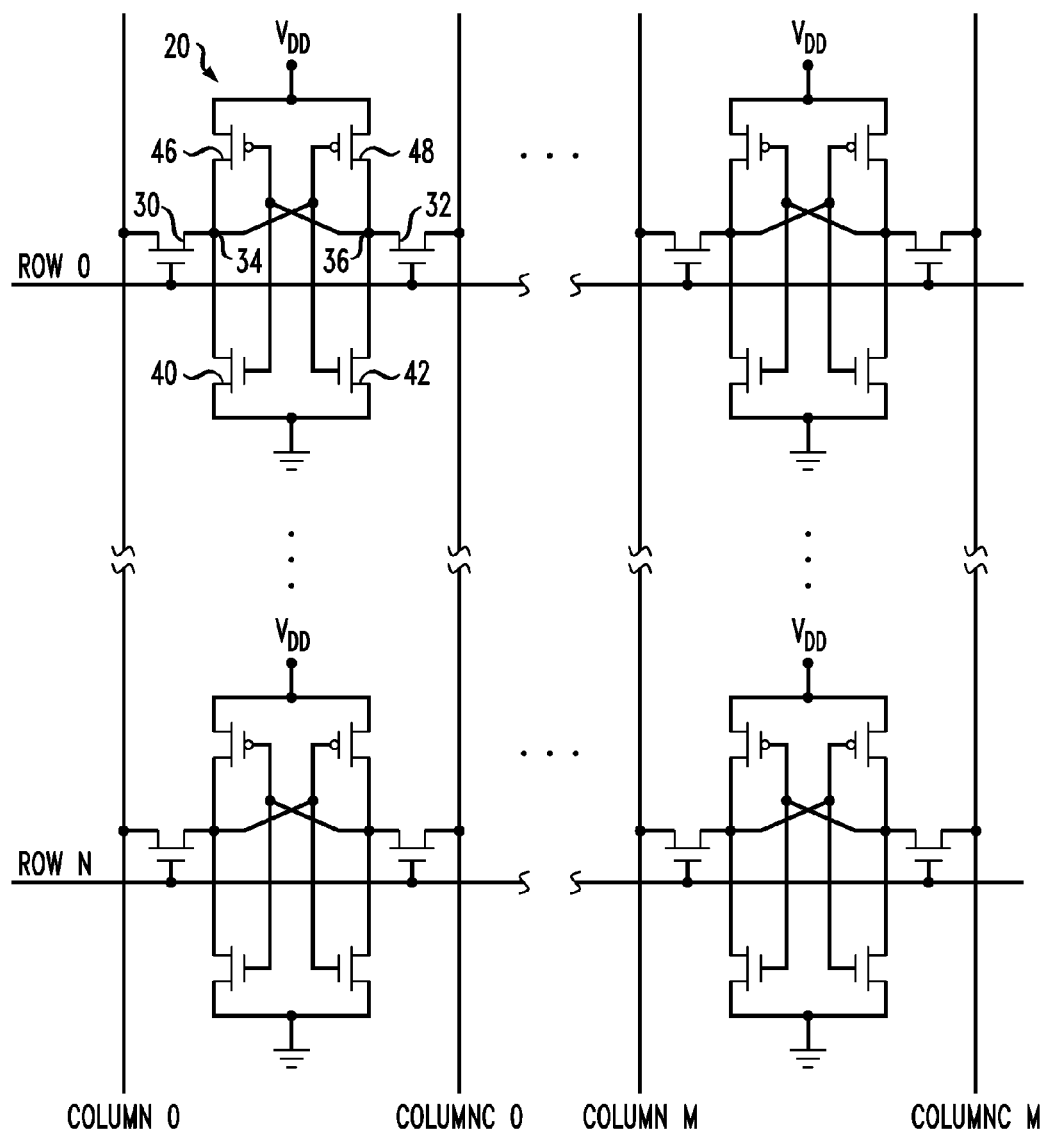
FIG. 1 is a schematic diagram depicting an exemplary static-random-access memory (SRAM) array which may be used in conjunction with an embodiment of the present invention.

FIG. 1 is a schematic diagram depicting an exemplary SRAM array 18 which may be used in conjunction with an embodiment of the invention. SRAM array 18 includes a plurality of SRAM cells 20 arranged in an array of N rows and M columns, where N and M are integers, with a cell residing at each intersection of a row and a column. SRAM cells 20 corresponding to a given row in SRAM array 18 are preferably connected to a common row line (e.g., Row 0 or Row N), also referred to as a word line. Likewise, SRAM cells 20 corresponding to a given column are connected to a common pair of complementary column lines (e.g., Column 0 and ColumnC 0, or Column M and ColumnC M), also referred to as bit lines. In each pair of column lines, ColumnC represents a logical complement of Column.

Each SRAM cell 20 is preferably a six-transistor cell, comprising two n-channel metal-oxide-semiconductor (NMOS) pull-down transistor devices 40 and 42, two p-channel metal-oxide-semiconductor (PMOS) pull-up transistor devices 46 and 48, and two NMOS access transistor devices 30 and 32. The invention is not limited to the specific memory cell configuration shown. More particularly, sources of devices 46 and 48 are connected together and are adapted for connection to a first voltage supply, which may be VDD; a drain of device 46 is connected to a drain of device 40 at node 34; sources of devices 40 and 42 are connected together and are adapted for connection to a second voltage supply, which may be ground; a drain of device 42 is connected to a drain of device 48 at node 36; gates of devices 46 and 40 are connected to the drains of devices 48 and 42 at node 36; and gates of devices 48 and 42 are connected to the drains of devices 46 and 40 at node 34. A drain of access transistor 30 is connected to node 34; a drain of access device 32 is connected to node 36; a source of device 30 is adapted for connection to a corresponding column line (e.g., Column 0); a source of device 32 is adapted for connection to a corresponding complement column line (e.g., ColumnC 0); and gates of devices 30 and 32 are connected to a corresponding row line (e.g., Row 0).

SRAM cells 20 may be arranged in an array, as shown in FIG. 1. For memory cells arranged in an array of N rows and M columns, it typically takes at least N memory read cycles to read all cells. Alternatively, SRAM cells 20 may be arranged in a single row (not shown), in which case the cells may all be accessed in a single memory read cycle. Additionally, the column lines are preferably oriented in a substantially vertical dimension and the row lines are preferably oriented in a substantially horizontal dimension, such that the row and column lines are substantially orthogonal relative to one another. It is to be understood, however, that the invention is not limited to any specific arrangement of the memory cells and/or orientation of the row and column lines. For example, other orientations of the row and column lines (e.g., diagonal) are similarly contemplated and are within the scope of the present invention.

When first powered up, a typical memory cell may be in one of two stable initial states, namely, a first state indicative of a logic high level (e.g., binary "1"), which may be VDD (e.g., about 3.3 volts), or a second state indicative of a logic low level (e.g., binary "0"), which may be zero volts. The term initial state, as used herein, is intended to be defined as the data state that the memory cell is in immediately after it is powered up and before it is written to. Ideally, an SRAM cell is designed to be a symmetrical and balanced circuit, thus the SRAM cell has an equal probability of being in an initial state of binary 1 or binary 0 when powered up. The initial state of a given memory cell is determined primarily by process variations and fluctuations. As with any physical structures, there are typically variations in dimensions, component concentrations and other physical properties.

Specifically, in the case of most types of memory cells, and in particular in SRAM memory cells, one or more variations in certain characteristics associated with transistors forming a given memory cell can occur, including, for example, doping levels within transistor source and drain regions, doping level within a transistor channel region, transistor gate oxide capacitance, trapped charge within transistor gate oxide, trapped charge within the transistor channel region, geometrical offsets between transistor regions, transistor channel length and transistor channel width, etc. Additionally, variations can occur in, for example, interconnect thickness, length and width, and in resistances and capacitances within the memory cell. These variations in physical and/or process parameters associated with the memory cells are predominantly random, and thus, for each memory cell, the binary state that is achieved in the cell after being powered up is essentially random.

It is to be appreciated that memory cells suitable for use with the present invention may comprise any circuit elements that can have initial states set by non-programmed process and/or dimensional variations. Such memory cells may include, but are not limited to, flip-flops, latches, the illustrative SRAM cell type shown in FIG. 1, other SRAM cell types, other complimentary metal-oxide-semiconductor (CMOS) circuit elements, etc.

Most SRAM cells in a memory array will have a large enough composite imbalance due to variations in process and/or dimensional characteristics associated with the cells to cause a repeatable initial state, hereinafter referred to as a definite initial state. In this instance, every time a memory cell is powered up, its initial state will always be the same; always a binary 0 state or always a binary 1 state. However, there may be a certain, albeit small, subset of memory cells in a memory array that are so nearly electrically balanced that such cells do not consistently power up in the same state. In this instance, there is generally not enough net imbalance to cause a definite initial state. Memory cells exhibiting a non-repeatable initial state, which may be referred to herein as an indefinite initial state, may be influenced by other, time variant, variables such as, but not limited to, chip temperature, supply voltage level, supply voltage slew rate and electrical noise (e.g., switching noise, cross-talk, etc.) in the vicinity of the cell.

Because process variations are essentially random, the repeatable initial state for a given memory cell is not known. Such initial state, while repeatable, has approximately equal probability of being a binary 1 or binary 0. For this reason, a security code constructed from the initial states of a number of memory cells will be a random number. In a memory array, memory cells having definite initial states provide a repeatable signature of the memory array. However, as previously stated, there may be a small subset of memory cells in the memory array which do not exhibit repeatable initial states. In such case, the resulting random number generated from the memory array will not be consistent every time the chip is powered up. For security code generation, it is desirable to have the resulting random number be the same every time the chip is powered up. Thus, in order to generate a repeatable random number, memory cells having an indefinite initial state must somehow be addressed.

In accordance with an aspect of the invention, error correction techniques are advantageously employed to define the states of memory cells having indefinite initial states. In general, error correction codes (ECCs) can be used to correct data read from a memory. One of the simpler forms of ECC is based upon block codes. A widely used block code is a Hamming code. Reed-Soloman (RS) and Bose-Chaudhuri-Hocquenghem (BCH) codes are other known error correction codes. Methods of error correction are well known in the art (see, e.g., Roberto Togneri and Christopher J. S. deSilva, "Fundamentals of Information Theory and Coding Design," Chapman & Hall/CRC Press, 2002). Accordingly, a detailed discussion of error correction theory will not be presented herein for economy of description. Techniques of the invention can be used to generate a security code that is random, reliable and repeatable upon powering up an IC. Moreover, the security code, which is generated as a function of net memory cell imbalances caused by IC process and/or dimensional variations, cannot be reasonably determined through known inspection and/or reverse engineering methodologies.

Figure 2:
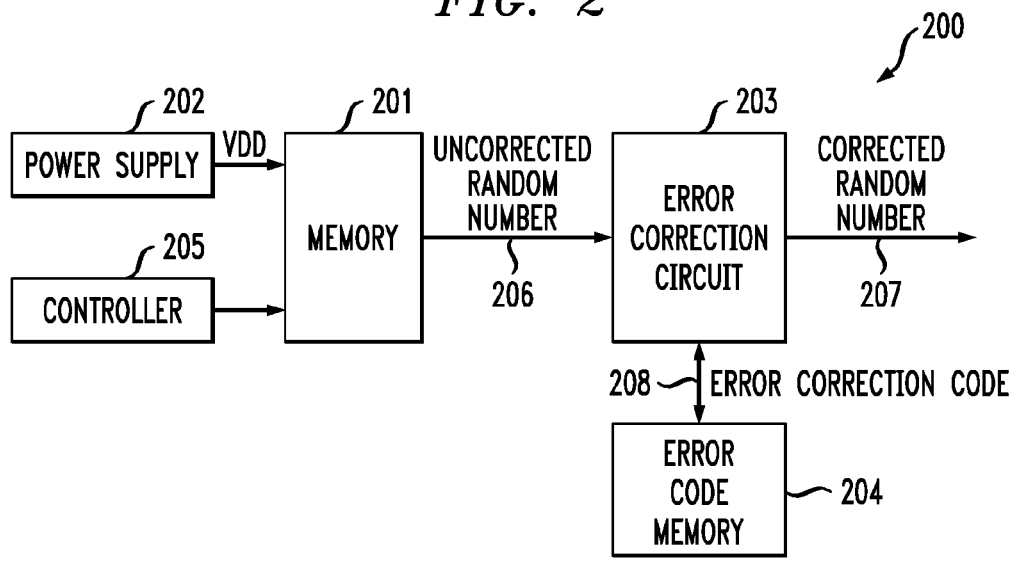
FIG. 2 is a block diagram depicting an exemplary random number generator circuit according to an embodiment of the invention.

FIG. 2 is a block diagram depicting an exemplary random number generator circuit 200 according to an embodiment of the present invention. Random number generator circuit 200 comprises a first memory 201, which may be an SRAM memory array, including a plurality of memory cells, or alternative storage elements. Memory 201 is adapted for connection to a power supply 202 operative to supply a source of voltage, which may be VDD, to the memory. Memory 201 is preferably nonvolatile and is operative to generate, as an output, a first signal 206, which may be an uncorrected random number, which is a function of respective initial states of the plurality of memory cells in the memory.

It is to be understood that ordinarily, SRAM is not considered to be nonvolatile memory since, as it is conventionally used, data stored in the SRAM is lost when power to the memory is removed (i.e., when the SRAM is powered down). However, in accordance with the teachings of the invention described herein, SRAM is employed as a nonvolatile storage medium for purposes of generating a secure random number, since at least a portion of the memory cells in the SRAM will have the same (i.e., repeatable) initial state each and every time the memory is powered up.

The memory cells in memory 201 may be arranged, for example, in an N-by-M array, wherein N and M are both integers. The invention is not limited to any particular size and/or arrangement of the memory cells in memory 201. By way of illustration only, memory 201 may comprise an array of 16 words by 32 bits (16-by-32 array). This arrangement requires 16 memory read cycles, each read cycle generating one 32-bit data word, to produce 512 bits of data. Random number generator circuit 200 may include a controller 205 coupled to memory 201 for controlling access to the memory cells in the memory. In one embodiment, controller 205 may comprise row and/or column related circuitry, as will be known by those skilled in the art. Alternatively, the memory cells in memory 201 may be arranged in a single row of M cells (e.g., a 1-by-M array). In this instance, for example, memory 201 may comprise M individual latches (not explicitly shown) functioning in parallel. The entire row of M memory cells may be read concurrently within a single memory read cycle. Using this arrangement of memory cells, the control circuitry required would be minimal or not needed, in which case controller 205 may be eliminated. However, this arrangement would require a considerably greater number of sense amplifiers for simultaneously reading the states of the memory cells, which may increase the overall area and cost of the IC.

Data words are preferably read from memory 201 after the memory has been powered up (e.g., at a prescribed time after VDD is applied to the memory) and after an initial state of the memory has been established. Reading memory 201 preferably enables a transfer of data words, upon which the uncorrected random number 206 is based, from the memory to subsequent processing circuitry in the random number generator circuit 200.

Random number generator circuit 200 further includes an error correction circuit 203 coupled to memory 201. As previously stated, a subset of memory cells in memory 201 may have indefinite initial states within a given data word which would otherwise produce an uncorrected random number 206 that is not consistently repeatable upon power-up of the memory. Error correction circuit 203 is preferably operative to correct data words generated by memory cells having indefinite initial states such that all data bits read from memory 201 will be definite (repeatable). Thus, a second signal 207, which may be a corrected random number, generated by error correction circuit 203 will be random but repeatable. The output security code generated by the random number generator circuit 200 is preferably a function of the corrected random number 207.

Depending on the error correction methodology employed by error correction circuit 203, a second memory 204, which may be an error code memory, may be optionally coupled to the error correction circuit. Memory 204 is preferably nonvolatile and is operative to store ECC bits used by the error correction methodology. These ECC bits are preferably programmed into memory 204 at some point in time when the security code (random number) is being established. This may be during or shortly after device factory or customer test. These ECC bits need only be programmed once, although they could be reprogrammed at a later time if it is desired to reset the security code. In accordance with one embodiment of the invention, memory 204 is programmed by initially powering up memory 201 and storing the initial states of the memory cells in memory 201 at the timing of programming. These programmed states are considered to be the "correct" state of memory 201. During subsequent power-up, the initial states of the memory cells in memory 201 will be compared to the "correct" state stored in memory 204 and any indefinite bits not matching the stored states will be corrected by error correction circuit 203.

In various embodiments of the invention, error correction circuit 203 may employ, for example, a block code (e.g., a Hamming code), a RS code, a BCH code, etc., in generating the corrected random number 207, although the invention is not limited to a particular error correction methodology. Where memory 201 is arranged as a single row of memory cells, a RS code or BCH code is preferably employed by error correction circuit 203, since RS and BCH codes generally require a relatively long series of data bits to detect and correct erroneous data bits. Certain error correction techniques have limitations on the number and/or arrangement of correctable bits. For example, Hamming codes, while simple to implement, can only correct one bit error per data word. Hamming codes are therefore preferred where the number of bits in a given data word is relatively small (e.g., less than about 16 bits). Other error correction techniques employed by error correction circuit 203 may not require storage of a memory code, and consequently memory 204 may be omitted.

Figure 3A:
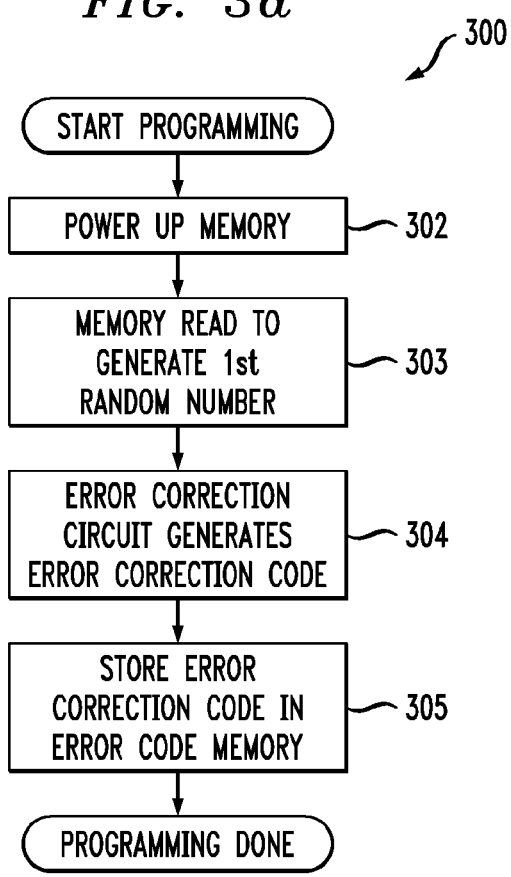
FIG. 3A depicts steps in an exemplary method for programming the error code memory shown in FIG. 2, in accordance with an embodiment of the invention.

With reference now to FIG. 3A, an exemplary method 300 for programming the illustrative error code memory 204 of FIG. 2 is shown, in accordance with an embodiment of the invention. Method 300, at least a portion of which may be performed in error correction circuit 203, can be used to set the "correct" state of the memory cells in memory 201 having indefinite initial states (see FIG. 2). In this manner, method 300 is preferably employed to correct non-repeatable bits in the uncorrected random number 206 generated from memory 201. A "non-repeatable bit," as the term is used herein, is intended to refer broadly to an output of a given memory cell in memory 201 that does not have a consistent initial state, such that upon successive applications of power to the memory, the initial state of the given memory cell may not necessarily be the same as the initial state of the given cell during one or more previous applications of power to the cell.

In order to program the error code memory 204, memory 201 is first powered up in step 302. In step 303, memory 201 is read to generate a first random number, based on uncorrected random number 206, which is forwarded to error correction circuit 203. This first random number may include bits that are non-repeatable. In step 304, error correction circuit 203 generates an error correction code 208 that is representative of the first random number. In step 305, the error correction code 208 is programmed into error code memory 204. As previously stated, the error correction code 208 may be a Hamming code for each data word read from memory 201. After programming error code memory 204, every time memory 201 is powered up, the error correction code 208 is used to detect and correct any erroneous bits to generate the corrected random number 207. Thus, corrected random number 207 generated by error correction circuit 203 will be random but repeatable.

Figure 3B:
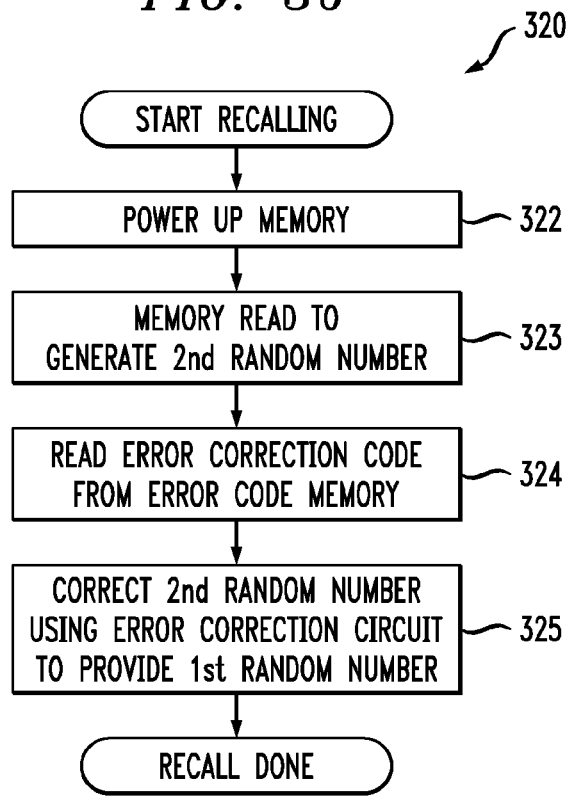
FIG. 3B depicts steps in an exemplary method for recalling a corrected random number, in accordance with an embodiment of the invention.

FIG. 3B depicts steps in an exemplary method 320 for recalling a corrected random number (e.g., 207 in FIG. 2), in accordance with an embodiment of the invention. Recall is preferably performed after error code memory 204 has been programmed, for example using exemplary method 300 depicted in FIG. 3A. Method 320 begins by powering up memory 201 in step 322. During power up, the initial states of all the bits in the uncorrected dataword are established. In step 323, a second random number is generated based on the uncorrected random number 206 read from memory 201. Because of non-repeatable bits, the second random number may be different from the first random number generated during the error code memory programming method 300 described above in conjunction with FIG. 3A. In step 324, the error correction code 208 is read from error code memory 204. Using this error correction code 208, any non-repeatable bits in the second random number having states that do not match corresponding states in the first random number, as indicated by the stored error correction code, are corrected in step 325. The corrected random number 207 will be generated from the second random number. This will be the same number as the first random number generated during the programming method 300. If, in step 323, it is determined that the second random is the same as the first random number generated in method 300, correction need not be performed. In this instance, steps 324 and 325 may be omitted.

Figure 4:
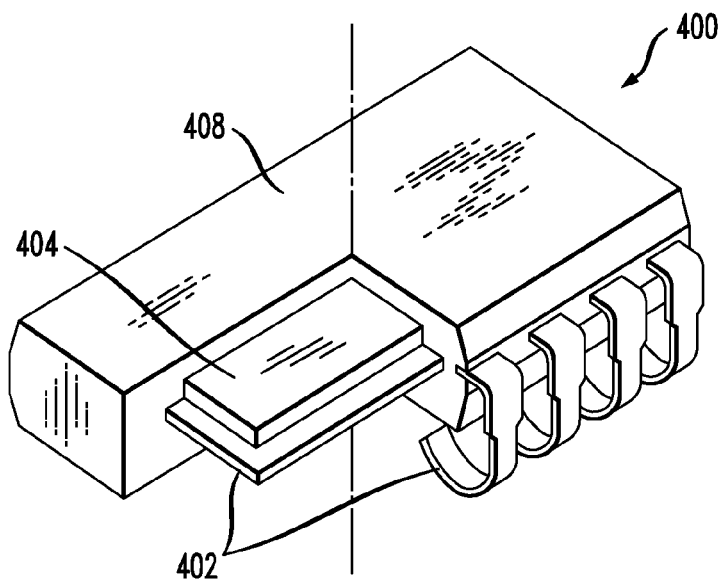
FIG. 4 is a partial sectional view depicting an exemplary packaged IC comprising at least one secure random number generator circuit according to an embodiment of the present invention.

At least a portion of the techniques of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. FIG. 4 is a partial sectional view depicting an exemplary packaged IC 400 comprising at least one secure random number generator according to an embodiment of the present invention. The packaged IC 400 comprises a leadframe 402, a die 404 attached to the leadframe, the die including a secure random number generator in accordance with an embodiment of the invention, and a plastic encapsulation mold 608. One skilled in the art would know how to dice wafers and package die to produce integrated circuits. Integrated circuits so manufactured are considered part of this invention.

An integrated circuit in accordance with the present invention can be employed in any application and/or electronic system which utilizes security codes. Suitable systems for implementing the invention may include, but are not limited to, personal computers, communication networks, electronic commerce systems, portable communications devices (e.g., cell phones), solid-state media storage devices, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A random number generator circuit, comprising:
  a first memory including a plurality of storage elements, each of the storage elements having an initial state corresponding thereto when powered up by a voltage supply source applied to the first memory, the first memory being operative to generate a first signal comprising a plurality of bits indicative of the respective initial states of the storage elements; and
  an error correction circuit coupled to the first memory, the error correction circuit being operative to receive the first signal and to correct at least one bit in the first signal that is not repeatable upon successive applications of power to the first memory to thereby generate a second signal, the second signal being a random number that is repeatable upon successive applications of power to the first memory;
  wherein the initial states of the respective storage elements comprise respective states that the storage elements are in after the storage elements are powered up and before the storage elements are written.

2. The random number generator circuit of claim 1, wherein the first memory comprises nonvolatile memory.

3. The random number generator circuit of claim 1, wherein the first memory comprises static random access memory.

4. The random number generator circuit of claim 1, further comprising a second memory coupled to the error correction circuit, the second memory being operative to store error correction code bits used by the error correction circuit in generating the second signal.

5. The random number generator circuit of claim 4, wherein at least one of the first and second memories comprises a non-volatile-memory.

6. The random number generator circuit of claim 1, wherein each of at least a subset of the plurality of storage elements comprises a complimentary metal-oxide-semiconductor circuit element.

7. The random number generator circuit of claim 1, wherein each of at least a subset of the plurality of storage elements comprises a latch element.

8. The random number generator circuit of claim 1, wherein the plurality of storage elements comprise respective static-random-access-memory elements, and wherein the first memory is not written until after the first memory is powered up by the power supply and the first memory generates the first signal.

9. The random number generator circuit of claim 1, further comprising a controller coupled to the first memory, the controller being operative to control access to the plurality of storage elements.

10. The random number generator circuit of claim 1, wherein the initial state of a given one of the plurality of storage elements is determined as a function of a variation in one or more characteristics associated with at least one transistor forming the given storage element.

11. The random number generator circuit of claim 10, wherein the one or more characteristics comprises at least one of doping levels within the at least one transistor source and drain regions, doping level within the transistor channel region, transistor gate oxide capacitance, trapped charge within transistor gate oxide, trapped charge within the transistor channel region, and geometrical offsets between transistor regions, transistor channel length and transistor channel width.

12. The random number generator circuit of claim 1, wherein the initial state of a given one of the plurality of storage elements is determined as a function of a variation in one or more time varying elements comprising at least one of temperature, supply voltage level, supply voltage slew rate, and electrical noise.

13. The random number generator circuit of claim 1, wherein the error correction circuit utilizes at least one of a block code, a Reed-Soloman code, and a Bose-Chaudhuri-Hocquenghem code in generating the second signal.

14. An integrated circuit comprising at least one random number generator circuit according to claim 1.

15. A method for generating a secure random number, the method comprising the steps of:

powering up a first memory comprising a plurality of storage elements, each of the storage elements having an initial state corresponding thereto when powered up;

generating a first signal comprising a plurality of bits indicative of the respective initial states of the storage elements; and correcting at least one bit in the first signal that is not repeatable upon successive applications of power to the first memory to thereby generate a second signal, the second signal being a random number that is repeatable upon successive applications of power to the first memory, the secure random number being indicative of the second signal;

wherein the initial states of the respective storage elements comprise respective states that the storage elements are in after the storage elements are powered up and before the storage elements are written.

16. The method of claim 15, further comprising the step of storing error correction code bits in a second memory, the error correction code bits being used in generating the second signal.

17. The method of claim 15, further comprising:

powering up the memory a second time, wherein the memory generates a second random number;

reading the error correction code in the error cede second memory; and correcting the second random number using the error correction code, wherein the corrected second random number is the first random number.

18. The method of claim 15, wherein the initial state of a given one of the plurality of storage elements is determined as a function of a variation in one or more characteristics associated with at least one transistor forming the given storage element.

19. The method of claim 15, wherein the initial state of a given one of the plurality of storage elements is determined as a function of a variation in one or more time varying elements comprising at least one of temperature, supply voltage level, supply voltage slew rate, and electrical noise.

20. An electronic system, comprising:

at least one integrated circuit including at least one random number generator circuit, the at least one random number generator circuit comprising:

a first memory including a plurality of storage elements, each of the storage elements having an initial state corresponding thereto when powered up by a voltage supply source applied to the first memory, the first memory being operative to generate a first signal comprising a plurality of bits indicative of the respective initial states of the storage elements; and an error correction circuit coupled to the first memory, the error correction circuit being operative to receive the first signal and to correct at least one bit in the first signal that is, not repeatable upon successive applications of power to the first memory to thereby generate a second signal, the second signal being a random number that is repeatable upon successive applications of power to the first memory;

wherein the initial states of the respective storage elements comprise respective states that the storage elements are in after the storage elements are powered up and before the storage elements are written.

* * * * *